United States Patent
Timmermans et al.

(10) Patent No.: US 11,092,886 B2
(45) Date of Patent: Aug. 17, 2021

(54) METHOD FOR FORMING A PELLICLE

(71) Applicants: IMEC VZW, Leuven (BE); Imec USA Nanoelectronics Design Center, Kissimmee, FL (US)

(72) Inventors: Marina Timmermans, Bertem (BE); Emily Gallagher, Burlington, VT (US); Ivan Pollentier, Langdorp (BE); Hanns Christoph Adelmann, Wilsele (BE); Cedric Huyghebaert, Heverlee (BE); Jae Uk Lee, Heverlee (BE)

(73) Assignees: IMEC VZW, Leuven (BE); Imec USA Nanoelectronics Design Center, Kissimmee, FL (US)

(*) Notice: Subject to any disclaimer, the term of this patent is extended or adjusted under 35 U.S.C. 154(b) by 253 days.

(21) Appl. No.: 15/979,827

(22) Filed: May 15, 2018

(65) Prior Publication Data
US 2018/0329291 A1    Nov. 15, 2018

(30) Foreign Application Priority Data
May 15, 2017   (EP) .................................. 17171171

(51) Int. Cl.
*G03F 1/62*    (2012.01)
*G03F 1/64*    (2012.01)

(52) U.S. Cl.
CPC . *G03F 1/64* (2013.01); *G03F 1/62* (2013.01)

(58) Field of Classification Search
CPC ..... G03F 1/64; G03F 1/62; G03F 1/22; C01B 32/159
See application file for complete search history.

(56) References Cited

U.S. PATENT DOCUMENTS

| 10,712,659 | B2* | 7/2020 | Gallagher | G03F 1/22 |
| 2005/0202684 | A1* | 9/2005 | Min | B82Y 30/00 438/778 |
| 2008/0152873 | A1* | 6/2008 | Okoroanyanwu | B82Y 10/00 428/195.1 |

(Continued)

FOREIGN PATENT DOCUMENTS

| EP | 3118683 A1 | 1/2017 |
| WO | 2005/085130 A2 | 9/2005 |

OTHER PUBLICATIONS

Pollentier et al., "EUV imaging using novel pellicle membranes", Proc. SPIE vol. 9776 article 977620 (14 pages) (Mar. 18, 2016).*
(Continued)

*Primary Examiner* — Martin J Angebranndt
(74) *Attorney, Agent, or Firm* — McDonnell Boehnen Hulbert & Berghoff LLP

(57) ABSTRACT

The present disclosure relates to a method for forming a pellicle for extreme ultraviolet lithography, the method comprising: forming a coating of a first material on a peripheral region of a main surface of a carbon nanotube pellicle membrane, the membrane including a carbon nanotube film, arranging the carbon nanotube pellicle membrane on a pellicle frame with the peripheral region facing a support surface of the pellicle frame, wherein the support surface of the pellicle frame is formed by a second material, and bonding together the coating of the carbon nanotube pellicle membrane and the pellicle support surface by pressing the carbon nanotube pellicle membrane and the pellicle support surface against each other. The present disclosure relates also relates to a method for forming a reticle system for extreme ultraviolet lithography.

18 Claims, 2 Drawing Sheets

(56) References Cited

U.S. PATENT DOCUMENTS

| | | | |
|---|---|---|---|
| 2012/0298289 A1* | 11/2012 | Jiang | C01B 32/19 156/155 |
| 2015/0309405 A1 | 10/2015 | Shih et al. | |
| 2016/0083872 A1 | 3/2016 | Zhang et al. | |
| 2016/0161857 A1 | 6/2016 | Levinson et al. | |
| 2016/0355001 A1* | 12/2016 | Kim | B32B 37/025 |
| 2017/0038676 A1 | 2/2017 | Jung et al. | |
| 2017/0082920 A1 | 3/2017 | Tseng et al. | |
| 2017/0176850 A1* | 6/2017 | Chen | G03F 7/20 |
| 2018/0329289 A1* | 11/2018 | Gallagher | G03F 1/64 |

OTHER PUBLICATIONS

Nasibulin et al. "Multifunctional free-standing single walled carbon nanotube films", ACS Nano vol. 5(4) pp. 3214-3221 (Mar. 2011).*

Kaskela et al., "Aerosol-synthesized SWCNT networks with tunable conductivity and transparency by a dry transfer technique", Nano Lett., vol. 10 pp. 4349-4355 (2010).*

Lin et al. "In-situ welding carbon nanotubes into a porous solid with super-high compressive strength and fatigue resistance", Scientific Reports 5 article 11336 10 pages (Jun. 2015).*

Tsai et al. "Conductivity enhancement of multiwalled carbon nanotube thin film via thermal compression method" Nanosc. Res. Lett., vol. 9 p. 451 (6 pages) (2014).*

Vanpaemel et al., "Alternative membrane develop,emt an imec". 20 pages (Feb. 2016).*

Kang et al., "efficient transfer or large-area graphene films onto rigid substrates by hot pressing", ACSnano vol. 6(6) pp. 5360-5365 (May 2012).*

European Search Report, European Patent Application No. 17171171. 6, dated Nov. 6, 2017, 6 pages.

* cited by examiner

METHOD FOR FORMING A PELLICLE

CROSS-REFERENCE TO RELATED APPLICATIONS

The present application is a non-provisional patent application claiming priority to European Patent Application No. 17171171.6, filed May 15, 2017, the contents of which are hereby incorporated by reference.

FIELD OF THE DISCLOSURE

The present disclosure relates to a method for forming a pellicle for extreme ultraviolet lithography and to a method for forming a reticle system for extreme ultraviolet lithography.

BACKGROUND

In semiconductor fabrication, various lithographic processes are extensively used in the course of defining devices and circuit patterns. Depending on the size of the features to be defined, different optical lithographic processes may be used. In general, as the patterns become smaller, shorter wavelengths are utilized. In extreme ultraviolet lithography ("EUVL"), a wavelength of about 13.5 nm is frequently used. In EUVL, a pattern present on a photomask or reticle may be transferred to a layer sensitive to extreme ultraviolet ("EUV") radiation by illuminating the reticle with EUV radiation. The EUV light is modulated by the reticle pattern and imaged onto a photoresist-coated wafer.

In conventional lithography, a pellicle is commonly placed above the reticle to protect the reticle from contamination during handling and exposure etcetera. The pellicle will thus protect the reticle from unwanted particles which otherwise could negatively impact the fidelity of the pattern transfer to the wafer. As the pellicle remains above the reticle during exposure, there are stringent requirements on the pellicle in terms of absorption, durability and particle shielding capabilities etcetera.

When it comes to EUVL it has been challenging to find suitable pellicle candidates. Conventional deep ultraviolet ("DUV") pellicles typically provide excessive absorption of extreme ultraviolet light even for very thin material thicknesses. Further, the high energy of the extreme ultraviolet light combined with the scanner environment is prone to damaging the material of the pellicle membrane. Thus, it has proved troublesome to identify pellicle designs that are compatible with EUVL.

SUMMARY

In view of the above, a general objective of the present disclosure is to provide method for forming a pellicle suitable for use in EUVL. Further objectives may be understood from the following.

According to a first aspect of the present disclosure, this and other objects are achieved by a method for forming a pellicle for extreme ultraviolet lithography, the method comprising: forming a coating of a first material on at least a peripheral region of a main surface of a carbon nanotube pellicle membrane, the membrane including a carbon nanotube film, arranging the carbon nanotube pellicle membrane on a pellicle frame with the peripheral region facing a support surface of the pellicle frame, wherein the support surface of the pellicle frame is formed by a second material, and bonding together the coating of the carbon nanotube pellicle membrane and the pellicle support surface by pressing the carbon nanotube pellicle membrane and the pellicle support surface against each other.

By the disclosed method a pellicle for extreme ultraviolet lithography may be formed by fixing the carbon nanotube pellicle membrane to the support surface of the pellicle frame.

More specifically, a coating of a first material is formed on at least a peripheral region of a main surface of a carbon nanotube pellicle membrane including a carbon nanotube ("CNT") film. Hence, a coating is formed on at least a peripheral region of the CNT pellicle membrane, meaning that the coating may cover also other regions of the CNT pellicle membrane, even an entire main surface of the CNT pellicle membrane.

It should be noted that within the context of this application the term "bonding together" may refer to any type of interaction resulting in any type of attractive force between the coating of the CNT pellicle membrane and the support surface of the pellicle frame which is greater than an attractive force resulting from merely positioning CNT pellicle membrane on top of the support surface. The resulting attractive force here refers to the force which remains after the pressure has been removed. As may be further described in the following, the bonding may be the result of chemical bonds between the coating of the CNT pellicle membrane and the support surface.

Accordingly, the present disclosure enables a method of forming a forming a pellicle for extreme ultraviolet lithography where the so formed pellicle exhibits a relatively high mechanical strength and low EUV light absorption. EUV light may have a wavelength in the range of 1 nm to 40 nm. More specifically, the CNT pellicle membrane of the pellicle formed according to the present disclosure may be reliable fixed or mounted to the pellicle frame of the pellicle. Moreover, by bonding together the coating of the CNT pellicle membrane and the pellicle support surface a durable bond which remains strong over time may be achieved. The so formed bond may be considered as clean in the sense that it is less prone to releasing particles, species and other elements which may contaminate e.g., a EUV scanner, as compared to standard attachment procedures relying on the use of conventional adhesives.

It should be noted that within the context of this application the term "pressing" may refer to the application of any type of mechanical pressure. In other words, any mechanical pressure that may be applied to press the CNT pellicle membrane and the support surface of the pellicle frame against each other may be intended. In an example embodiment, a pressure of at least 0.1 kPA is applied to the at least one CNT film.

In an example embodiment, the pressing may include applying a pressure of 0.1 kPa to 30 MPa, which may be beneficial in that the CNT pellicle membrane and the support surface of the pellicle frame may be bonded together. In an example embodiment, the bonding may take place under vacuum conditions. By applying a sufficiently low pressure, cold welding of the CNT pellicle membrane and the support surface of the pellicle frame may occur, thereby forming a strong bonding between the CNT pellicle membrane and the support surface of the pellicle frame.

The pressing may as an example be performed by pressing the CNT pellicle membrane and the support surface of the pellicle frame between a pair of pressing surfaces. The term "pressing surface" may thus refer to any type of surface which may be used to apply a mechanical pressure to the CNT pellicle membrane and the support surface of the pellicle frame. For this reason, one or both of the pressing surfaces may be actuated or moved so as to apply a mechanical pressure. In general, one of the pressing surfaces is typically moved and pressed against the other pressing surface, thereby applying a pressure to the CNT pellicle membrane and the support surface of the pellicle frame.

It should be noted that within the context of this application the term "CNT film" may refer to any connected arrangement of CNTs, such as a mesh, a web, a grid, or similar formed of individual CNTs or bundles of CNTs. Individual CNTs (which may be single walled CNTs ("SWCNTs") or multi walled CNTs ("MWCNTs")) of each CNT film may be aligned to form bundles. Such bundles of aligned CNTs tend to form spontaneously during manufacture of CNT films. Accordingly, bonding together overlapping CNTs may include bonding together overlapping individual CNTs or overlapping CNT bundles.

The CNTs or CNT bundles of the CNT film may be randomly arranged within the CNT film. The CNTs or CNT bundles of the CNT film may however be arranged or aligned along a predominant or major direction or along a plurality of major directions.

The CNTs of the CNT film may be single walled CNTs ("SWCNTs"). Accordingly, each of the at least one CNT film may be formed by SWCNTs or bundles of SWCNTs. A SWCNT may be described as a cylindrical or tubular molecule of a single graphene sheet. The at least one CNT film may be formed of SWCNTs with a diameter in the range of 0.5-2 nm. SWCNTs may typically present low absorption of EUV radiation.

The CNTs of the CNT film may also be multi walled CNTs ("MWCNTs"). Accordingly, each of the at least one CNT film may be formed by MWCNTs or bundles of MWCNTs. MWCNTs may be described as two or more concentric cylinders of tubes of SWCNTs or graphene sheets. The at least one CNT film may be formed by MWCNTs with diameters in the range of 5-30 nm.

In an example embodiment, the CNT pellicle membrane may be a free-standing CNT pellicle membrane, which may refer to any CNT membrane being free-standing or self-supporting in the sense that it is capable of supporting its own weight when being suspended by e.g. a frame, such as a pellicle frame. In other words, the free-standing CNT pellicle membrane is capable of supporting its own weight when having a size being relevant for use in EUV pellicles, without any appreciable sagging.

By using a free-standing CNT pellicle membrane the so formed pellicle may exhibit a relatively high mechanical strength and low EUV light absorption. Also particle retention properties and chemical resistance of the pellicle may be enhanced.

The CNT pellicle membrane may comprise a plurality of CNT films arranged on top of each other in a stacked fashion. The CNT pellicle membrane may for example include 2, 3, or 4 CNT films just to give a few non-limiting examples. Any number of CNT films may be used. The CNT films may be bonded together so as to form the CNT pellicle membrane.

If the CNT pellicle membrane includes more than one CNT film, the CNT films may be bonded together by bonds formed between overlapping CNTs of different films. The CNT films may have been bonded together to form the CNT pellicle membrane prior to the CNT pellicle membrane being arranged on the pellicle frame.

The coating may be formed such that the coating is formed on individual CNTs or on individual CNT bundles of the at least one CNT film. The coating may be a conformal coating. The coating may be formed on the surface of the CNTs such that the CNTs or CNT bundles are partially enclosed or completely enclosed by the coating.

According to one embodiment, the act of bonding may include applying a vacuum having a pressure below 1 mbar to the CNT pellicle membrane and the pellicle frame. A low ambient pressure and/or an elevated temperature may facilitate the fixing or cold welding of the CNT pellicle membrane to the pellicle frame. A pressure below 1 mbar may be used. Lowering the pressure further enables cold welding at reduced temperatures. In an example embodiment, an ambient pressure in the range of $10^{-10}$ mbar to $10^{-6}$ bar may be used. An ambient pressure in this range enables reliable bonding of the pellicle membrane and the pellicle frame.

According to one embodiment, the support surface may be formed by a first material and the coating may be formed by a second material, the first material being a metal or a semiconductor, the second material being a metal or a semiconductor. By having the support surface being formed by a first material and the coating being formed by a second material, the CNT pellicle membrane may be fixed to the pellicle frame by cold welding. A eutectic may be formed during the cold welding. A eutectic may be formed by the first material and the second material at the interface between the materials at a relatively low temperature.

Typical material combinations or systems may also be metal-semiconductor systems as they may form eutectics at relatively low temperatures. However, cold welding for metal-metal systems and semiconductor-semiconductor systems may also be employed. Example combinations of materials forming eutectics may include: Ru and Ge; Pd and Ge; Ru and Si; Nb and Si.

According to one embodiment, the first material and the second material may be chosen from the group consisting of: Zr, Mo, Ru, Pd, Nb, Ge and Si, which may be beneficial in that suitable material combinations at the interface between the coating of the CNT pellicle membrane and the support surface of the pellicle frame may be realized.

According to one embodiment, the first material and the second material may be the same materials, which may be beneficial in that the risk of damaging one of the first material and the second material during bonding together may be reduced. In other words, if the same material is used for the first material and the second material processing parameters, such as heat, pressure etcetera may not have to account for differences in material properties.

According to one embodiment, the method may further comprise, heating the CNT pellicle membrane and the pellicle frame while applying the pressure, which may be beneficial in that the bonding may be facilitated. Moreover, heat and pressure may in combination allow the amount of stress of the CNT membrane to be controlled. The CNT pellicle membrane and the pellicle frame may for example be heated to a temperature within the range from 100 to 500° C. while applying the pressure. In case a eutectic is to be formed, the CNT pellicle membrane and the pellicle frame may be heated to a temperature within the range from 600 to 900° C. while applying the pressure. However, keeping the temperature below 600° C. may put less stress on the CNT pellicle membrane and coatings.

According to one embodiment, the act of bonding may include pressing the CNT pellicle membrane and the support surface together by means of a mechanical pressure while applying a vacuum having a pressure below 1 mbar to the CNT pellicle membrane and the pellicle frame, which may be beneficial in that the bonding may be further facilitated and that cold welding may occur. In an example embodiment, the mechanical pressure may be a pressure of 0.1 kPa to 30 MPa.

According to one embodiment, the method may further comprise increasing a tensile stress in the CNT pellicle membrane. The tensile stress may be increased prior to arranging the CNT pellicle membrane on the pellicle frame. However, it is also be possible to increase the tensile stress subsequent to attaching the CNT pellicle membrane to the pellicle frame. The tensile stress may be increased by subjecting the CNT pellicle membrane to a thermal treatment process. The thermal treatment process may include heating the CNT pellicle membrane to an elevated temperature (i.e., above room temperature). Additionally or alternatively the thermal treatment process may include cooling the CNT pellicle membrane to a reduced temperature (i.e., below room temperature).

The tensile stress may also be increased by mechanical means. Accordingly, according to one embodiment, the method may further comprise, stretching the CNT pellicle membrane in a lateral direction prior to arranging the CNT pellicle membrane on the pellicle frame. By stretching the CNT pellicle membrane in a lateral direction prior to arranging the CNT pellicle membrane on the pellicle frame, sagging of the CNT pellicle membrane may be counteracted. In other words, the CNT pellicle membrane may exhibit a reduced sagging if stretched in a lateral direction prior to being arranged on the pellicle frame.

The CNT pellicle membrane may be stretched in a single direction, i.e. along a single lateral or surface direction. The CNT pellicle membrane may be stretched in a plurality of lateral directions, such as in normal directions to its edges or in lateral radial directions of the membrane to give a few examples.

According to one embodiment, the pellicle frame may comprise a frame body of a third material which is different from the second material. By this arrangement, a suitable material for the frame body of the pellicle frame may be selected while not influencing the properties of the support surface of the pellicle frame. It is thus possible to form a frame body of the pellicle frame by a material having desired properties in terms of e.g. mechanical strength, thermal expansion or weight, without negatively affecting the bonding capabilities or properties of the support surface of the pellicle frame.

The pellicle frame may be formed by Si, SiN, SiO$_2$, or quartz. These materials present a thermal expansion compatible with the thermal expansion of the CNT pellicle membrane.

The pellicle frame body may be formed by a plurality of materials in order to achieve desired properties. The pellicle frame body may for example be formed by a stack of material layers arranged on top of each other or by a mixture of different materials.

The support surface of the pellicle frame may be formed as a coating on the pellicle frame body, which may be beneficial in that the properties of the pellicle frame body and the support surface may be tuned essentially independently of each other. Moreover, the same type of pellicle frame body may be provided with different types of support surfaces to suit different needs. In other words, the same type of pellicle frame body may be combined with CNT pellicle membranes of different kinds or CNT pellicle membranes having different coatings.

According to one embodiment, the frame body may be permeable to air, which may be beneficial since the CNT pellicle membrane of the pellicle may be subjected to less mechanical stress when subjected to pressure changes. By a frame body which may be permeable to air, air may migrate through the material of the frame body during e.g. vacuum pumping or pressure increase. This means that the frame body may assist in equilibrating a pressure change taking place on one side of the CNT pellicle membrane of the pellicle.

According to one embodiment, the coating may be formed to cover the entire main surface of the CNT pellicle membrane, which may be beneficial in that the same coating may be used for the bonding as well as for providing desired properties of the CNT pellicle membrane. Further, the coating may protect the CNTs of the membrane from the potentially adverse process environments during EUVL, for instance during hydrogen plasma cleaning processes. Moreover, by forming a coating on a free-standing CNT pellicle membrane the membrane may exhibit a low absorption of extreme ultraviolet light, rendering the membrane suitable for EUV applications.

According to an aspect of the present disclosure a method for forming a reticle system for extreme ultraviolet lithography is disclosed. The method comprising: forming a pellicle in accordance with what has been disclosed above, and mounting the pellicle on a reticle. By mounting a pellicle of the above disclosed kind to a reticle, a reticle system for extreme ultraviolet lithography may be formed. The reticle system so formed may thus be used in extreme ultraviolet lithography, where the pellicle mounted to the reticle protects the reticle from particles by acting as a physical barrier.

According to a further aspect of the present disclosure there is provided a pellicle for extreme ultraviolet lithography, the pellicle comprising: a pellicle frame having a support surface, and a carbon nanotube pellicle membrane including at least one carbon nanotube film, wherein a coating of a first material is provided on at least a peripheral region of a main surface of the carbon nanotube pellicle membrane, wherein the support surface of the pellicle frame is formed by a second material and wherein the peripheral region of the carbon nanotube pellicle membrane is attached to the support surface of the pellicle frame.

The carbon nanotube pellicle membrane and the frame may be bonded together. In line with the above discussion, the term "bonding together" may refer to any type of interaction resulting in any type of attractive force between the coating of the CNT pellicle membrane and the support surface of the pellicle frame which is greater than an attractive force resulting from merely positioning CNT pellicle membrane on top of the support surface. The resulting attractive force here refers to the force which remains after the pressure has been removed. As may be further described in the following, the bonding may be the result of chemical bonds between the coating of the CNT pellicle membrane and the support surface.

According to one embodiment, the support surface may be formed by a first material and the coating may be formed by a second material, the first material being a metal or a semiconductor, the second material being a metal or a semiconductor. The coating on the peripheral region may be cold-welded to the support surface. The CNT pellicle membrane may thus be fixed to the pellicle frame by cold welding. The cold-weld may be formed by a eutectic. A eutectic may be formed by the first material and the second material at the interface between the materials at a relatively low temperature.

Typical material combinations or systems may also be metal-semiconductor systems as they may form eutectics at relatively low temperatures. However, cold welding for metal-metal systems and semiconductor-semiconductor systems may also be employed. Example combinations of materials forming eutectics may include: Ru and Ge; Pd and Ge; Ru and Si; Nb and Si.

According to one embodiment, the first material and the second material may be chosen from the group consisting of: Zr, Mo, Ru, Pd, Nb, Ge, and Si, which may be beneficial in that suitable material combinations at the interface between the coating of the CNT pellicle membrane and the support surface of the pellicle frame may be realized.

According to one embodiment, the first material and the second material may be the same materials, which may be beneficial in that the risk of damaging one of the first material and the second material during bonding together may be reduced. In other words, if the same material is used for the first material and the second material processing parameters, such as heat, pressure etcetera may not have to account for differences in material properties.

BRIEF DESCRIPTION OF THE FIGURES

The above, as well as additional objects and features of the present disclosure, will be better understood through the following illustrative and non-limiting detailed description of example embodiments, with reference to the appended drawings. In the drawings like reference numerals will be used for like elements unless stated otherwise.

As illustrated in the figures, the sizes of features, layers and regions are exaggerated for illustrative purposes and, thus, are provided to illustrate the general structures of embodiments of the present disclosure. Like reference numerals refer to like elements throughout.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will now be described more fully hereinafter with reference to the accompanying drawings, in which example embodiments of the disclosure are shown. This disclosure may, however, be embodied in many different forms and should not be construed as limited to the embodiments set forth herein; rather, these embodiments are provided for thoroughness and completeness, and fully convey the scope of the disclosure to the skilled person.

A method for forming a pellicle for EUVL will now be described, with reference to the drawings. According to the method a CNT membrane, coated in at least a peripheral region of a main surface thereof, is arranged on a pellicle frame with the peripheral region facing a support surface of the pellicle frame. The support surface and the CNT membrane is bonded together by pressing the carbon nanotube pellicle membrane and the pellicle support surface against each other.

The CNT membrane includes at least one CNT film. A method for forming a CNT pellicle membrane 102 suitable for use in the EUVL pellicle will now be described with reference to FIG. 1.

Figure 1:
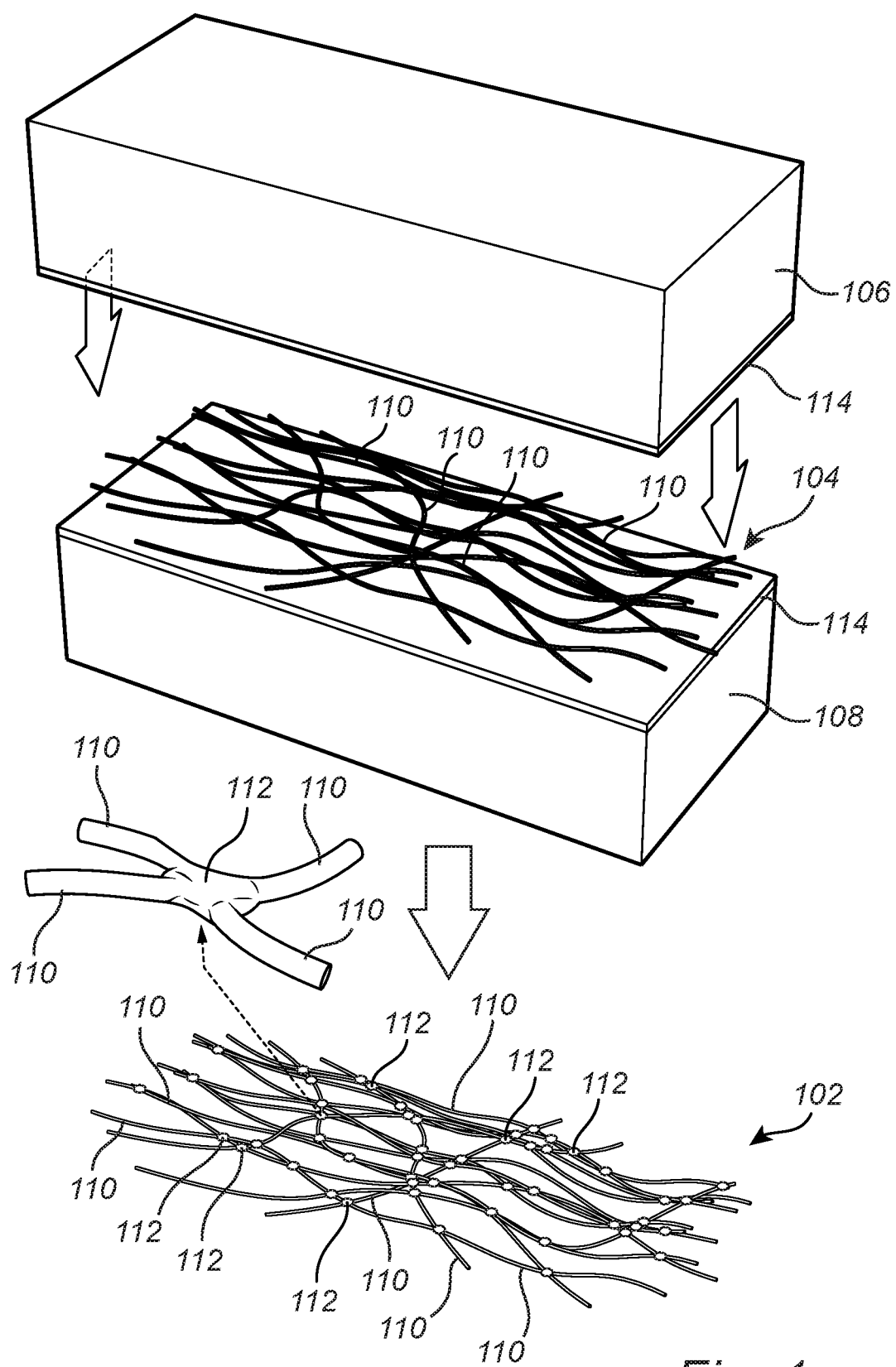
FIG. 1 is a schematic perspective view of a CNT film arranged between pressing surfaces and a CNT pellicle membrane formed by pressing the CNT film, according to an example embodiment.

In FIG. 1, a CNT film 104 is arranged between a first pressing surface 106 and a second pressing surface 108. The CNT film 104 may be a prefabricated CNT film or may be fabricated in conjunction to being arranged between the first and second pressing surfaces 106, 108. The CNT film 104 of FIG. 1 is a so-called free standing CNT film 104, which means that the CNT film 104 is self-supporting in the sense that it can support its own weight when being suspended from e.g., a pellicle frame or similar. As an alternative, a less strong CNT film not capable of supporting its own weight may be used. In either case, the CNT film 104 may be arranged on a temporary carrier (not shown), for instance in the form of a filter, for instance a cellulose-based or paper filter.

As is schematically depicted in FIG. 1, the individual CNTs 110 of the CNT film 104 are overlapping each other in the sense that the individual CNTs 110 crosses each other within the CNT film 104. In example embodiments, the CNTs 110 of the CNT film 104 may be single walled CNTs, SWCNTs. However, double or multi walled CNTs, DWCNTs, or MWCNTs, may be used alternatively.

The individual CNTs of the depicted CNT film 104 are arranged randomly within the CNT film 104 in the sense that the CNTs 110 are not arranged within the CNT film 104 along a major or predominant direction. However, the CNTs of the CNT film 104 may be provided in ordered manner. The CNTs 110 may for example be provided along a major direction or a plurality of major directions.

The CNTs may also be bundled within the CNT film 104 in the sense that a plurality of individual CNTs form a bundle (i.e., a string or rope-like structure), wherein the CNT film is formed of a plurality of bundles forming a web of aligned or randomly oriented CNT bundles. Accordingly, each element 110 shown in FIG. 1 may alternatively refer to a CNT bundle. A CNT bundle 110 may include, for instance, 2-20 individual CNTs. In a CNT bundle 110, individual CNTs may be aligned and joined along their longitudinal directions. CNTs of a bundle may also be joined end-to-end such that the length of the CNT bundle is greater than the length of the individual CNTs. The CNTs may typically be joined by van der Waals forces.

The individual CNTs 110 (or bundles 110) of the CNT film 104 may be coated with a coating, not shown. The coating may be a metal coating of Mo. The coating may at least partially cover the CNTs 110 in the sense that the individual CNTs or the bundles are partially or completely enclosed by the coating, while still forming network of partially free CNTs within the CNT film 104, as depicted in FIG. 1. In an example embodiment, a thickness of the coating on the CNTs 110 may be within the range 1 nm to 30 nm, as this may form a reliable protection of the CNTS of the CNT film 104 from process conditions during use. In other embodiments, a coating thickness in the range of 1 to 10 nm may be used to enable both a reliable protection and a sufficient transmission to EUV radiation. The coating may be formed using any suitable technique as is known in the art, for instance by physical vapor deposition ("PVD"), chemical vapor deposition ("CVD") or atomic layer deposition ("ALD").

Other examples of suitable coatings include B, $B_4C$, ZrN, Ru, SiC, TiN, a-C, and graphene coatings to give a few examples. In other words, coatings of the above material may equally well be used in the above example. For EUV applications, suitable coatings could include coatings which exhibit a limited absorption of extreme ultraviolet light.

As an alternative, a coating may, instead of being formed around the individual CNTs or bundles 110, be formed as a coating layer on one or both main surfaces of the CNT film 104.

In order to bond together overlapping CNTs 110 of the CNT film 104, the CNT film 104 may be pressed between the first and the second pressing surfaces 106, 108. The pressing surfaces 106, 108 may thus be pressed together so as to apply a mechanical pressure to the CNT film 104.

The applied pressure for coated CNTs 110, may be approximately 0.1 kPa or greater. In an example embodiment, the applied pressure may not exceed 30 MPa. Such a pressure is sufficient for bonding to take place between the coatings of the CNTs 110 at locations where the CNTs 110 overlap, such that the CNTs adhere to each other at the overlapping locations. It is to be noted that bonding need not occur at all overlapping locations. The stated pressures may here refer to an average pressure applied over the area of the CNT film 104.

A cold-weld may be formed between the coatings of the CNTs 110 at locations where the CNTs overlap. The bonding taking place at overlapping locations during the pressing is thus enhancing the strength and integrity of the CNT film 104, thereby forming a free-standing CNT pellicle membrane 102. As may be understood, the pressure may increase locally where the CNTs 110 overlap and stack, which facilitates the bonding together of the overlapping CNTs 110. For reasons of clarity the locations 112 at which the bonding has taken place are indicted by dots or bonds 112 in the lower portion of FIG. 1.

More specifically, in the lower portion of FIG. 1, it is depicted how the free-standing CNT pellicle membrane 102 formed by pressing the film 104 may include bonding locations 112 at locations where the CNTs or CNT bundles 110 overlap each other. The bonding locations 112 are as described above illustrated as dots in FIG. 1 for illustrative purposes.

The CNT film 104 may be subjected to a vacuum below 1 mbar during the pressing to facilitate the formation of the bonds 112. In an example embodiment, an ambient pressure in the range of $10^{-10}$ mbar to $10^{-6}$ bar may be used. To further facilitate the formation of the bonds 112, the CNT film 104 may be heated while being pressed between the pressing surfaces 106, 108. The CNT film 104 may for example be heated to a temperature within the range of 20 to 500° C. while applying the pressure. In an example embodiment, the CNT film 104 may be heated to a temperature below 300° C. while applying the pressure.

A CNT pellicle membrane 102 may alternatively be formed by pressing a CNT film 104 of uncoated CNTs or CNT bundles 110, i.e., CNTs having no coating on its external surfaces. In this case, the CNTs 110 of the CNT film 104 will be in direct contact at locations where the CNTs 110 overlap. Also in this case, the CNT film 104 is pressed between the pressing surfaces 106, 108 as described above. When the CNTs 110 of the CNT film 104 are uncoated, a pressure in the range of 10-30 GPa may be applied in order for the bonding to take place between the overlapping CNTs 110 of the CNT film 104. In this case, the bonding will take place directly between the CNTs 110 of the CNT film 104. Direct bonds, for instance co-valent bonds, may form between carbon atoms of overlapping CNTs of the CNT film 104.

Moreover, a plurality of CNT films 104 may be arranged on top of each other in a stacked manner between the first pressing surface 106 and the second pressing surface 108 in which case bonding will take place within each film and also between the plurality of films, thereby forming the free-standing CNT pellicle membrane 102.

An example embodiment of a free-standing CNT pellicle membrane 102 formed in accordance with a method of the above will now be described. According to this embodiment, the membrane 102 includes or is formed of SWCNTs. The individual CNTs 110 may have a diameter of 0.5-2 nm. Alternatively, the membrane 102 includes or is formed of MWCNTs. The individual CNTs 110 may have a diameter of 5-30 nm. For both SWCNTs and MWCNTs the individual CNTs 110 may have an average length >100 μm. A typical gap between adjacent CNTs 112 may be <30±100 nm. The gap may also be referred to as the pore size.

The CNT pellicle membrane 102 may be formed of two to three CNT films 104 arranged on top of each other in a stacked manner during the pressing. Similar results may however be achieved for four or more CNT films 104 arranged on top of each other in a stacked manner during the pressing.

In an example embodiment, the thickness of the CNT pellicle membrane 102 may be in the range of 5-50 nm. The thickness of the CNT pellicle membrane 102 may be greater depending on the porosity of the CNT pellicle membrane 102. An important parameter of the CNT pellicle membrane 102 is the amount of atoms/cm², as the atoms will absorb or attenuate the EUV light impinging on the CNT pellicle membrane 102. In other words, the number of atoms/cm² will influence the transmission efficiency of the CNT pellicle membrane 102. To achieve a transmission of 90% an equivalent thickness of 15 nm graphite or 2.266 g/cm³ may be used in the CNT pellicle membrane 10. These values roughly correspond to $1.7 \cdot 10^{17}$ carbon atoms/cm² of the pellicle membrane 102. With this insight at hand it is understood that what is important is to form or build a strong CNT membrane 102 with or without coatings which CNT membrane 102 has desired particle retention properties while still having no more than $1.7 \cdot 10^{17}$ carbon atoms/cm² or a carbon atom density no greater than 2.266 g/cm³.

Membranes having the above characteristics have been subjected to extensive measurements aiming at determining the above characteristics as well as how the membranes works for EUV pellicle applications in practice. The diameter and the average length of the CNTs are mainly set in the course of producing the CNT films 104 used to form the CNT pellicle membrane 102. Also the gap or pore size is impacted by how densely the CNTs are arranged within the CNT films 104 used. However, the pore size the CNT pellicle membrane 102 being formed will also be impacted on the number of CNT films 104 used. A larger number of CNT films 104 will result in a denser CNT pellicle membrane 102, i.e. a CNT pellicle membrane 102 having a smaller pore size. In general, a denser or less porous CNT pellicle membrane 102 will exhibit better particle retention but may suffer from greater absorption of extreme ultraviolet light. In practice also the diameter and the average length of the CNTs will impact the porosity of the CNT pellicle membrane 102. SEM and TEM may be used to measure the above parameters.

Membranes having the above characteristics have exhibited a high stability to extreme ultraviolet light. A typical transmission loss for a CNT membrane following 100 wafer exposures has been measured to be less than 0.1%. The transmission of extreme ultraviolet light is typically >90% which is a desired value for EUV pellicle applications. Examples of processes for synthesis of SWCNTs and MWCNTs include techniques based on arc-discharge methods, laser ablation, and CVD methods including floating catalyst (aerosol) CVD synthesis. Non-limiting examples of aerosol synthesis techniques is found in WO 2005/085130. An example process for forming aligned CNTs is found in US2016/0083872.

It should be noted that the method for forming a CNT pellicle membrane 102 disclosed above in connection with FIG. 1 merely represents one manner of forming CNT pellicle membrane 102 suitable for being attached to a pellicle frame to form a EUVL pellicle. Similarly, the example embodiment of the free-standing CNT pellicle membrane merely represents one possible structure of a CNT pellicle membrane. However, any other technique which results in a CNT pellicle membrane 102, for example, of a free-standing type, may also be used.

Figure 2:
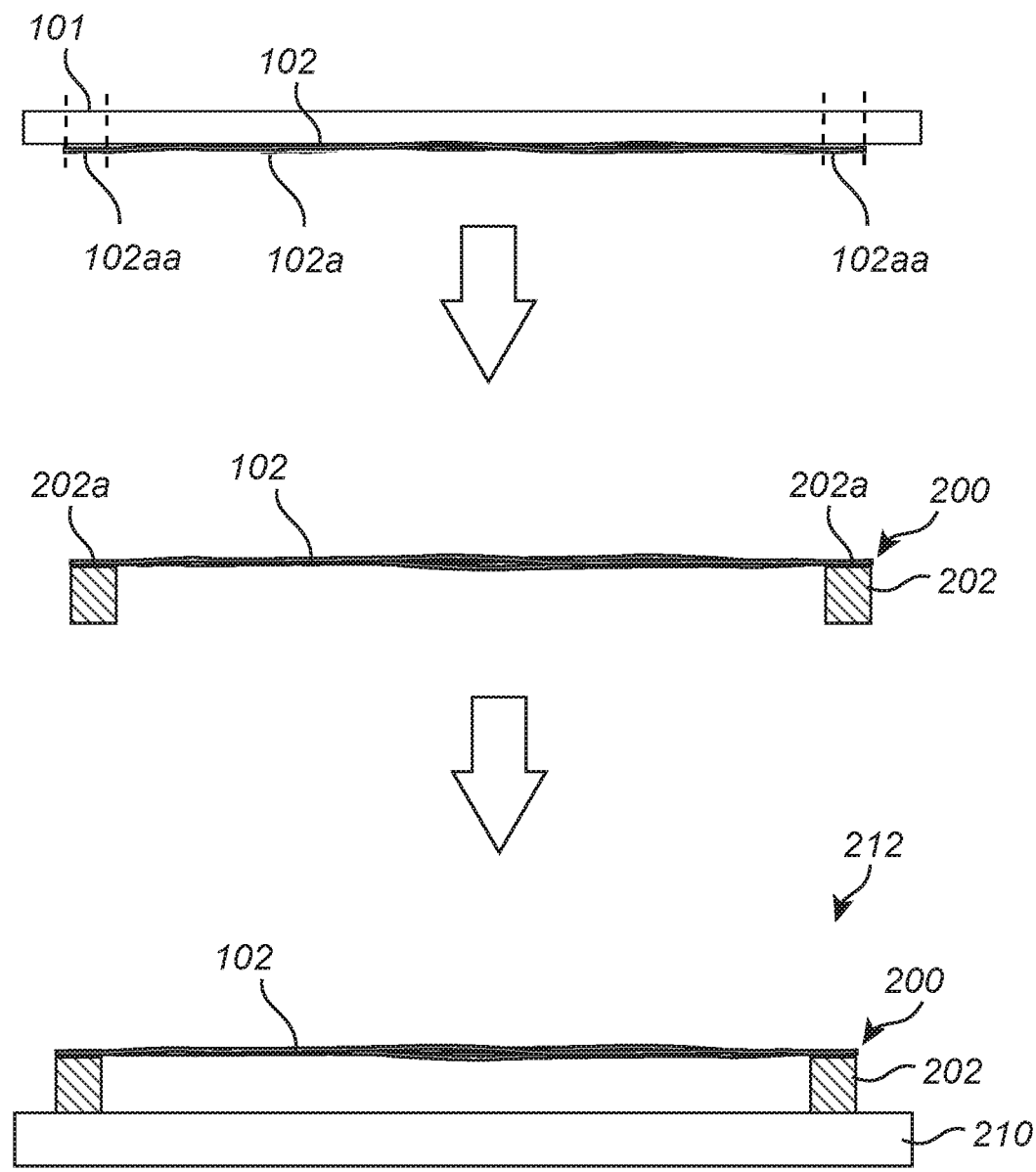
FIG. 2 is a schematic view of a method for forming a pellicle by bonding a carbon nanotube pellicle membrane to a pellicle frame, according to an example embodiment.

With reference to FIG. 2 there is shown a method for forming a pellicle 200 by bonding a CNT pellicle membrane, such as the CNT pellicle membrane 102, to a pellicle frame 202.

A coating is formed on the CNT pellicle membrane 102. The coating may be formed on the CNT pellicle membrane 102 in a manner as described above. The coating may be formed prior to or subsequent to the pressing of the CNT film 104, also as described above. Alternatively, a separate or additional coating may be formed on the CNT pellicle membrane 102, for the purpose of facilitating attachment to the pellicle frame 202. In either case, the coating may be formed at an entire main surface 102a of the CNT pellicle membrane 102 or only at a peripheral region 102aa of the CNT pellicle membrane 102. By peripheral region 102aa is intended a region of the CNT pellicle membrane 102 which is to be arranged in abutment with and to be fixed to the pellicle frame 202.

The coated CNT pellicle membrane 102 that is to be fixed to the pellicle frame 202 is arranged on a support surface 202a of the pellicle frame 202. The support surface 202a of the pellicle frame 202 is typically an upper surface of the pellicle frame 202. The pellicle frame 202 may include a number of sidewalls, such as two pairs of mutually opposite sidewalls.

For handling purposes, the CNT pellicle membrane 102 may be arranged on a carrier or a temporary substrate 101. The CNT pellicle membrane 102 may be transferred to the pellicle frame 202. The main surface 102a of the CNT pellicle membrane 102 facing away from the carrier 101 may be arranged in abutment with the pellicle support surface 202a.

The coating of the CNT pellicle membrane 102 and the pellicle support surface 202a are then bonded together by pressing the CNT pellicle membrane 102 and the pellicle support surface 202a against each other. The CNT pellicle membrane 102 will thereby be fixed to the support surface 202a of the pellicle frame given that a sufficient pressure is used. A pressure of 0.1 kPa to 30 MPa is generally sufficient for bonding together the CNT pellicle membrane 102 and the support surface 202a of the pellicle frame 202, given that the CNTs 110 of the CNT pellicle membrane 102 are coated as described above. If a carrier 101 is used for handling the CNT pellicle membrane 102, the carrier 101 may be removed from the CNT pellicle membrane 102 prior to or subsequent to the bonding of the CNT pellicle membrane 102 to the pellicle frame 202.

In order to bond together the coated CNT pellicle membrane 102 and the pellicle support surface 202a, the support surface 202a is typically formed by a first material and the coating of the CNTs is typically formed by a second material. Several different material combinations or systems will work for bonding together the CNT pellicle membrane 102 and the pellicle support surface 202a.

The first material may be a metal or a semiconductor, the second material may be a metal or a semiconductor. Typically, the material of the support surface 202a and the material of the coating are different materials. Examples of relevant material combinations or systems which may bonded together are Ru and Ge, Pd and Ge, Ru and Si, and Nb and Si. The above examples may be bonded together by being cold welded, while forming a eutectic. The skilled person realizes that other material combinations may be used to bond together the coated CNT pellicle membrane 102 and the pellicle support surface 202a and that the required pressure may vary for the different materiel combinations being used. For instance, the support surface 202a of the pellicle frame 202 may formed by a first metal and the coating of the CNT pellicle membrane 102 may be formed by a second metal. It may thereby be possible to form a eutectic of the first metal and the second metal during the pressing by selecting a material combination capable of forming a eutectic.

Further, the material of the support surface 202a and the material of the coating may be the same material.

The act of bonding may include applying a vacuum having a pressure below 1 mbar to the CNT pellicle membrane 102 and the pellicle frame 202. The CNT pellicle membrane 102 and the pellicle frame 202 may be subjected to a vacuum below 1 mbar during the pressing to facilitate the formation of the bonds. In an example embodiment, an ambient pressure in the range of $10^{-10}$ mbar to $10^{-6}$ bar may be used.

To further facilitate the formation of the bonds, the CNT pellicle membrane 102 and the pellicle frame 202 may be heated while being pressed against each other. The CNT pellicle membrane 102 and the pellicle frame 202 may for example be heated to a temperature within the range of 20 to 500° C. while applying the pressure. In an example embodiment, the CNT pellicle membrane 102 and the pellicle frame 202 may be heated to a temperature below 300° C. while applying the pressure.

The pellicle frame 202 may be formed of the same material as the support surface 202a or may be of a different material. In other words, the pellicle frame 202 may include a frame body onto which the material forming the support surface 202a is applied. The support surface 202a may for instance be formed as a thin metal or semiconductor coating on top of an upper surface of the pellicle frame 202. By this arrangement, the properties of the support surface 202a and the pellicle frame 202 may be tailored independent of each other. For instance, the pellicle frame 202 or frame body may be permeable to air, which reduces the risk of damaging the CNT pellicle membrane 102 when the pellicle 200 is subjected to pressure fluctuations, which for example may occur when transferred into a vacuum environment. The pellicle frame 202 may for instance be formed by Si, SiN, $SiO_2$, or quartz, or a layer stack or a combination of such materials. Other materials for the pellicle frame 202 include metal, plastic or ceramic materials to give a few examples.

The method may further comprise stretching the CNT pellicle membrane 102 in a lateral direction prior to arranging the membrane 102 on the pellicle frame 202. By pre-stretching the CNT pellicle membrane 102, sagging of the membrane 102 may be counteracted. In other words, may exhibit a reduced sagging if stretched in a lateral direction prior to being arranged on the pellicle frame 202. In an example embodiment, a tensile stress of approximately 100 MPa or more may be introduced in the CNT pellicle membrane 102. This may translate to a membrane deflection of less than 0.5 mm for a pellicle of typical dimensions.

Pre-stretching the CNT pellicle membrane 102 may include transferring the CNT pellicle membrane 102 to an intermediate stretchable support. For instance, the aforementioned temporary substrate 101 may be arranged as a stretchable support. The CNT pellicle membrane 102 may adhere to the stretchable support due to attractive forces at the surface interface between the CNT pellicle membrane 102 and the stretchable support. Any suitable type of stretchable support may be used, such as a stretchable or elastic membrane. The stretchable support may be arranged in a stretching tool adapted to stretch the stretchable support wherein the CNT pellicle membrane 102 may be stretched. The CNT pellicle membrane 102 may subsequently be transferred to the pellicle frame 202. The stretchable support may thereafter be removed from the CNT pellicle membrane 102.

Tensile stress may also be introduced in the CNT pellicle membrane 102 by other means such as by subjecting the CNT pellicle membrane to a thermal treatment process. The thermal treatment process may include heating the CNT pellicle membrane to an elevated temperature (i.e., above room temperature). Additionally or alternatively the thermal treatment process may include cooling the CNT pellicle membrane to a reduced temperature (i.e., below room temperature). Also, applying a coating to the CNT pellicle membrane may increase the tensile stress in CNT pellicle membrane.

Still referring to FIG. 2, here is conceptually depicted how the pellicle 200 is mounted on a reticle 210 to form a reticle system 212, where the reticle system 212 includes the pellicle 200 and the reticle 210. The pellicle 200 may be mounted to the reticle 210 using any suitable means as is known in the art, such as by means of an adhesive. The pellicle frame 202 defines an opening or aperture above the reticle 210. The pellicle membrane 102 covers the aperture. The pellicle membrane 102 is suspended in front of the reticle 210 by the pellicle frame 202. A height or thickness of the pellicle frame 202 may be such that a distance between the main surface of the reticle 210 and the pellicle membrane 102 is in the range of 1 mm to 6 mm.

Additionally, variations to the disclosed embodiments can be understood and effected by the skilled person in practicing the claimed disclosure, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for forming a pellicle for extreme ultraviolet lithography, the method comprising:
    forming a coating of a first material on at least a peripheral region of a main surface of a carbon nanotube pellicle membrane, the membrane including a carbon nanotube film;
    arranging the carbon nanotube pellicle membrane on a pellicle frame with the peripheral region of the main surface of the carbon nanotube pellicle membrane facing a support surface of the pellicle frame, wherein the support surface of the pellicle frame is formed by a second material;
    increasing a tensile stress in the carbon nanotube pellicle membrane prior to or subsequent to arranging the carbon nanotube pellicle membrane on the pellicle frame;
    wherein increasing the tensile stress in the carbon nanotube pellicle membrane prior to arranging the carbon nanotube pellicle membrane on the pellicle frame further comprises stretching the carbon nanotube pellicle membrane in a lateral direction upon a stretchable support, and wherein increasing the tensile stress in the carbon nanotube pellicle membrane subsequent to arranging the carbon nanotube pellicle membrane on the pellicle frame further comprises cooling the carbon nanotube pellicle membrane to below room temperature; and
    bonding together the coating of the carbon nanotube pellicle membrane and the support surface of the pellicle frame by heating the carbon nanotube pellicle membrane and the pellicle frame while applying pressure, wherein the carbon nanotube pellicle membrane and the support surface of the pellicle frame are pressed against each other.

2. The method according to claim 1, wherein the step of bonding includes applying a vacuum having a pressure below 1 mbar to the carbon nanotube pellicle membrane and the pellicle frame.

3. The method according to claim 1,
    wherein the support surface of the pellicle frame is formed by the first material and the coating is formed by the second material,
    wherein the first material is a metal or a semiconductor, and
    wherein the second material is a metal or a semiconductor.

4. The method according to claim 1, wherein the first material and the second material are selected from the group consisting of: Zr, Mo, Ru, Pd, Nb, Ge, and Si.

5. The method according to claim 1, wherein the first material and the second material are the same materials.

6. The method according to claim 1, wherein the step of bonding includes pressing the carbon nanotube pellicle membrane and the support surface of the pellicle frame together by means of a mechanical pressure.

7. The method according to claim 6, wherein the pressing the carbon nanotube pellicle membrane includes applying a pressure of 0.1 kPa to 30 MPa.

8. The method according to claim 1, wherein the pellicle frame comprises a frame body of a third material which is different from the second material.

9. The method according to claim 8, wherein the frame body is permeable to air.

10. The method according to claim 1, wherein the pellicle frame is formed by Si, SiN, SiO$_2$, or quartz.

11. The method according to claim 1, wherein the coating is formed to cover an entire main surface of the carbon nanotube pellicle membrane.

12. The method according to claim 1, wherein heating the carbon nanotube pellicle membrane and the pellicle frame includes heating the carbon nanotube pellicle membrane and the pellicle frame from 100 to 900° C.

13. A method for forming a reticle system for extreme ultraviolet lithography, the method comprising:
    forming a pellicle according to claim 1; and
    mounting the pellicle on a reticle.

14. A reticle system for extreme ultraviolet lithography, formed according to the method of claim 13.

15. A pellicle for extreme ultraviolet lithography, the pellicle comprising:
    a pellicle frame having a support surface; and
    a carbon nanotube pellicle membrane including at least one carbon nanotube film,
    wherein a coating of a first material is provided on at least a peripheral region of a main surface of the carbon nanotube pellicle membrane,
    wherein the support surface of the pellicle frame is formed by a second material,
    wherein the peripheral region of the carbon nanotube pellicle membrane is attached to the support surface of the pellicle frame by way of a heat and pressure bonding process, and
    wherein the carbon nanotube pellicle membrane is under tensile stress from at least one of stretching the carbon nanotube pellicle membrane in a lateral direction upon a stretchable support, or cooling the carbon nanotube pellicle membrane below room temperature.

16. The pellicle according to claim 15, wherein the pellicle frame and the carbon nanotube pellicle membrane are bonded together.

17. The pellicle according to claim 15, wherein the first material and the second material are selected from the group consisting of: Zr, Mo, Ru, Pd, Nb, Ge, and Si.

18. The pellicle according to claim 15, wherein first material and the second material are the same materials.

* * * * *